(12) United States Patent
Higuchi et al.

(10) Patent No.: US 6,653,668 B2
(45) Date of Patent: *Nov. 25, 2003

(54) RADIO FREQUENCY MODULES AND MODULES FOR MOVING TARGET DETECTION

(75) Inventors: Katsuhiko Higuchi, Higashihiroshima (JP); Shinichiro Takatani, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/231,000

(22) Filed: Aug. 30, 2002

(65) Prior Publication Data

US 2003/0006436 A1 Jan. 9, 2003

Related U.S. Application Data

(63) Continuation of application No. 09/793,113, filed on Feb. 27, 2001, now Pat. No. 6,469,326.

(30) Foreign Application Priority Data

Feb. 28, 2000 (JP) ........................................ 2000-055920

(51) Int. Cl.$^7$ ............................................. H01L 31/072
(52) U.S. Cl. ........................ 257/192; 257/24; 257/194; 257/195; 257/197; 257/604

(58) Field of Search .......................... 257/24, 192, 194, 257/195, 197, 604

(56) References Cited

U.S. PATENT DOCUMENTS

| | | | |
|---|---|---|---|
| 4,065,768 A | 12/1977 | Kondoh et al. | |
| 4,538,165 A | 8/1985 | Chang et al. | |
| 5,285,087 A | 2/1994 | Narita et al. | |
| 5,453,631 A | 9/1995 | Onda et al. | |
| 5,473,175 A | 12/1995 | Nikaido et al. | |
| 5,650,642 A | 7/1997 | Sawada et al. | |
| 6,037,619 A | 3/2000 | Morizuka et al. | |
| 6,469,326 B2 * | 10/2002 | Higuchi et al. ............. | 257/192 |

* cited by examiner

Primary Examiner—Nathan J. Flynn
Assistant Examiner—Remmon R. Fordé
(74) Attorney, Agent, or Firm—Mattingly, Stanger & Malur, P.C.

(57) ABSTRACT

It is an object of the present invention to provide a radio frequency module incorporating an MMIC that has a high S/N ratio while ensuring a high output.

A radio frequency module according to the present invention incorporates an MMIC having a field effect transistor in which channel layers for traveling of carriers are formed by a heterostructure of two or more different kinds of materials, and height of a potential barrier of an interface between the different kinds of materials is less than 0.22 eV.

12 Claims, 8 Drawing Sheets

RADIO FREQUENCY MODULES AND MODULES FOR MOVING TARGET DETECTION

This is a continuation application of U.S. Ser. No. 09/793,113, U.S. Pat. No. 6,469,326, filed on Feb. 27, 2001.

BACKGROUND OF THE INVENTION

1. Field of the Invention

The present invention relates to a radio frequency module. The present invention relates particularly to a radio frequency module incorporating a monolithic microwave integrated circuit (hereinafter abbreviated to an MMIC) fabricated by using a field effect transistor capable of achieving a high S/N ratio. More particularly, the present invention relates to a field effect transistor that can achieve a high S/N ratio. Still more particularly, the present invention relates to a module for moving target detection.

2. Related Arts

For a radio frequency module, especially a module required to provide a high output, the following techniques are employed. For high output, there is known a technique in which a high electron mobility transistor, commonly referred to as a HEMT, which has a channel layer of high indium content is used in an MMIC including an amplifier (hereinafter abbreviated to an amplifier MMIC). This technique is intended to improve device current drivability and increase output of the amplifier MMIC by using a channel layer of high indium content, for example a layer of indium, gallium, and arsenic having a high mobility and a high saturation rate. The technique is described in the IEEE MICROWAVE AND GUIDED WAVE LETTERS Vol.4 No.8, pp.277–278, for example.

In addition, for high output of an amplifier MMIC, there is known a technique that uses a HEMT whose channel layer comprises a layer of indium, gallium, and arsenic and a layer of indium and phosphorus. This channel structure is referred to as a composite channel. A conventional technique that uses a HEMT having a composite channel in an amplifier MMIC is described in the IEEE Transactions on Electron Devices Vol.42 No.8, p.1413, for example.

It is accordingly an object of the present invention to provide a radio frequency module incorporating an MMIC that has a high S/N ratio while ensuring a high output. More technically, the present invention is intended to achieve high S/N ratio of a field effect transistor that is a main active device forming an amplifier, an oscillator, or a mixer of the MMIC. In addition, the present invention is intended to enable the field effect transistor to have a high S/N ratio while ensuring a high output. Problems in achieving the above are factors that cause degradation in characteristics of a monolithic microwave integrated circuit having an oscillator formed with the field effect transistor (hereinafter abbreviated to an oscillator MMIC), an amplifier MMIC, and the like. Problems in achieving the above are factors that cause degradation in characteristics of a transmitter or a receiver having such an oscillator MMIC or an amplifier MMIC. The oscillator MMIC particularly has a problem of degradation in noise characteristics, while the amplifier MMIC particularly has a problem of difficulty in achieving high output at its amplifying stage, especially at its final stage. The amplifier MMIC also invites degradation in noise characteristics.

Accordingly, it is another object of the present invention to provide a radio frequency module that includes an oscillator or an amplifier having excellent S/N characteristics.

Various forms of field effect transistors used in conventional radio frequency modules, typified by a HEMT, each have problems that make it difficult to fully meet objects of the present invention. In addition to a HEMT with an ordinary structure, a HEMT with a composite channel has been proposed. The HEMT with a composite channel serves an object of the present invention to achieve high current drivability and high breakdown voltage.

A field effect transistor according to the present invention is intended to prevent breakdown due to physical characteristics of its channel materials or to avoid a problem of increase in noise caused by the composite channel. In other words, the present invention is intended to avoid problems of the composite channel and achieve both high current drivability and high breakdown voltage.

SUMMARY OF THE INVENTION

Radio frequency modules according to the present invention have the following configurations.

According to a typical aspect of the present invention, there is provided a radio frequency module comprising monolithic microwave integrated circuits on a single substrate which include at least an oscillator, an amplifier, and a receiver, at least one of the oscillator, the amplifier, and the receiver including a field effect transistor having a channel region with a junction of two or more different kinds of materials.

According to another aspect of the present invention, there is provided a radio frequency module comprising an amplifier MMIC portion including at least a field effect transistor, the field effect transistor having a channel region with a junction of two or more different kinds of materials, and height of a potential barrier of a junction interface between the different kinds of materials in the channel region being less than 0.22 eV.

According to a further aspect of the present invention, there is provided a radio frequency module comprising an oscillator MMIC portion; an amplifier MMIC portion for amplifying an output signal of the oscillator MMIC portion; a receiver MMIC portion for amplifying a received signal; and a terminal for extracting an intermediate frequency signal by mixing an output signal from the receiver MMIC portion with the output signal from the oscillator MMIC portion; the oscillator MMIC portion, the amplifier MMIC portion, the receiver MMIC portion, and the terminal being mounted on a single semiconductor substrate, and at least one of the oscillator MMIC portion, the amplifier MMIC portion, and the receiver MMIC portion including a field effect transistor having a channel region with a junction of two or more different kinds of materials.

According to a further aspect of the present invention, there is provided a radio frequency module comprising an amplifier MMIC portion including at least a field effect transistor; and an oscillator MMIC portion including at least a field effect transistor, the field effect transistors each having a channel region with a junction of two or more different kinds of materials, and height of a potential barrier of a junction interface between the different kinds of materials in the channel region, experienced by conductor carriers, being less than 0.22 eV.

According to the present invention, it is particularly important that the height of a potential barrier of an interface between the different kinds of materials be less than 0.22 eV. Reasons for this will be described later.

According to a further aspect of the present invention, there is provided a module for moving target detection comprising monolithic microwave integrated circuits on a single substrate which include at least an oscillator, an amplifier, and a receiver, at least one of the oscillator, the amplifier, and the receiver including a field effect transistor having a channel region with a junction of two or more different kinds of materials. According to a further aspect of the present invention, there is provided a module for moving target detection, wherein height of a potential barrier of a junction interface between the different kinds of materials in the channel region is less than 0.22 eV.

The field effect transistor according to the present invention can be configured as various field effect transistors such as a HEMT, a MESFET (Metal Semiconductor Field Effect Transistor) and a MOSFET (Metal Oxide Semiconductor Field Effect Transistor). The HEMT is especially useful for radio frequency applications in the present invention.

In general, such a field effect transistor is formed of compound semiconductor materials. A typical example of the compound semiconductor materials is III–V compound semiconductor materials, and among others, InP compound semiconductor materials are often used.

The HEMT is a field effect transistor comprising a first semiconductor layer containing an impurity; and a second semiconductor layer having a smaller band gap than that of the first semiconductor layer, the first semiconductor layer and the second semiconductor layer being joined together to form a heterostructure, the second semiconductor layer containing substantially no impurity, and the second semiconductor layer or an interface of the heterostructure functioning as a channel region. A gate electrode is disposed on the side of the first semiconductor layer containing an impurity. A channel region formed by a plurality of semiconductor layers is referred to as a composite channel. As described above, this composite channel is useful in achieving high output. The band gap of a semiconductor layer of the composite channel on a side farther from a gate electrode is generally selected to be larger than that of a semiconductor layer on the gate electrode side.

The gate electrode side is generally disposed on a side opposite from a crystal substrate with the channel region intermediate between the gate electrode side and the crystal substrate; conversely, of course, the gate electrode side may be disposed on the crystal substrate side. Thus, the HEMT in the present specification may be formed by making various common modifications thereto in accordance with the technical concept of the present invention.

DESCRIPTION OF THE INVENTION

Figure 1:
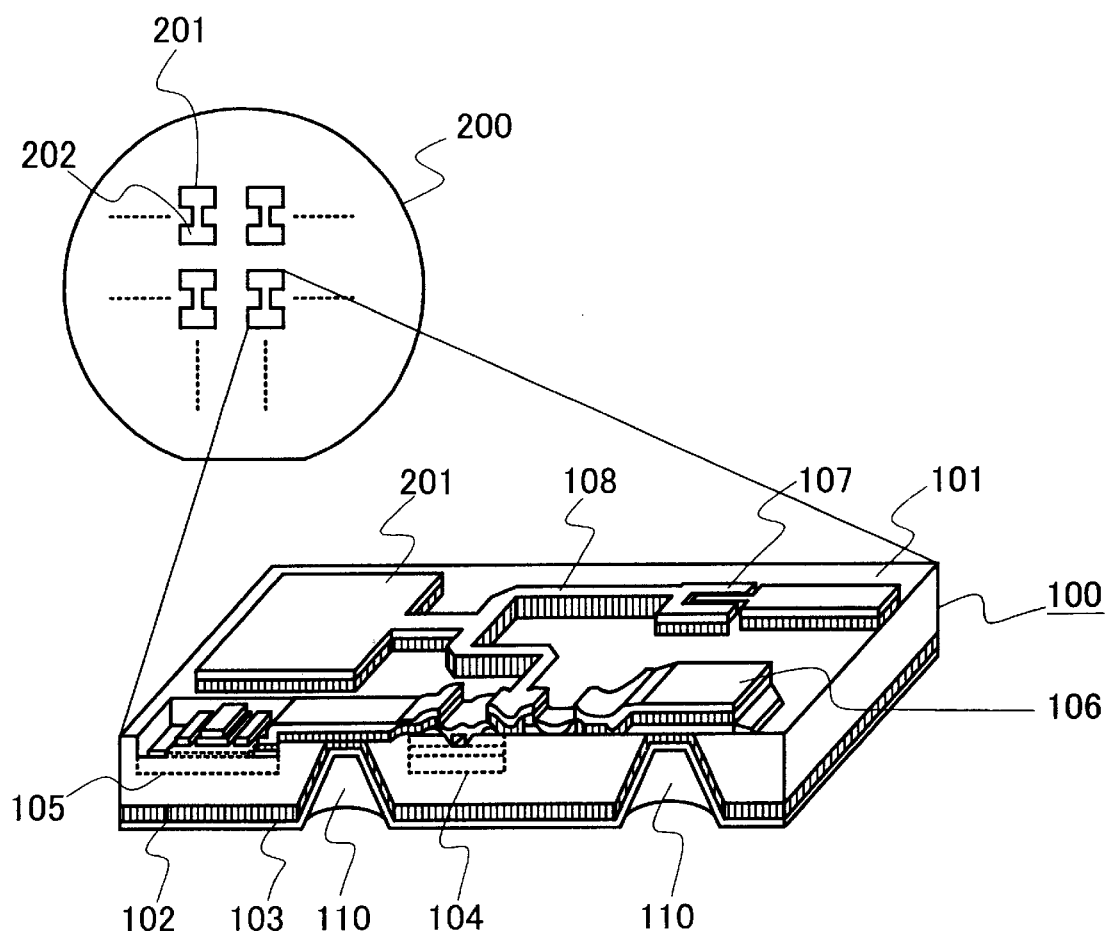
FIG. 1 is a diagram of assistance in explaining a monolithic microwave integrated circuit.

FIG. 1 shows a wafer 200 for forming an MMIC and a configuration example of the MMIC in perspective view. This example is one of a so-called microstrip type MMIC. Various microwave circuit devices are formed on a surface 101 of a semiconductor substrate 100, while a ground conductor 103 is formed on an underside 102 thereof. The semiconductor substrate 100 is formed by using a compound semiconductor of GaAs and InP, or Si, for example. Active devices such as a field effect transistor and a bipolar transistor as well as a resistance, a capacitance, an inductance, a transmission line or the like are formed on the surface of the semiconductor substrate. A grounding via-hole 110 is usually formed in the semiconductor substrate 100. An antenna 201 and a transceiver module 202 are illustrated in FIG. 1 as being in array arrangement on the wafer 200. FIG. 1 also illustrates a field effect transistor 104, an HBT (Hetero Bipolar Transistor) 105, a capacitor 106, an interdigital capacitor 107, a microstrip line 108, and a patch antenna 201.

The present invention relates to structure of a field effect transistor included in such an MMIC. It is to be noted that circuit configuration itself of an amplifier MMIC for amplifying an output signal of the oscillator MMIC, a receiver MMIC for amplifying a received signal, and the like suffices to be the same as that of an ordinary radio frequency module. An example of circuit configuration of these integrated circuits will be illustrated in the section of description of preferred embodiments.

By using a field effect transistor according to the present invention as a main component device of the oscillator, it is possible to prevent degradation in its noise characteristics. In addition, by using the field effect transistor at an amplifying stage of an amplifier, especially at its final stage, it is possible to achieve a higher output. Moreover, it is possible to prevent degradation in noise characteristics of an amplifier MMIC. Furthermore, by using the field effect transistor according to the present invention as a main component device of a mixer, it is possible to prevent degradation in its noise characteristics. It is possible to obtain a high S/N ratio also in a receiver or the like using such an amplifier, for example.

As described above, a most important feature of the field effect transistor according to the present invention is that the field effect transistor has a channel region with a junction of two or more different kinds of materials. Typical examples of the two kinds of channel layers include undoped InAsP and undoped InGaAs, or undoped InGaAs and undoped InGaP.

As described above, the band gap of a semiconductor layer of the composite channel on a side farther from a gate electrode is selected to be larger than that of a semiconductor layer on the gate electrode side. The larger band gap is advantageous from a viewpoint of breakdown voltage of the semiconductor layer. Therefore the field effect transistor using this semiconductor layer enables a high output. However, a junction of the semiconductor layers whose band gaps differ greatly results in a potential barrier difference, and thus it is desirable to form the junction while gradually reducing the difference between the band gaps. Such a junction is generally referred to as a graded junction.

When this graded junction is used in the present invention, practical as the channel layers of the field effect transistor are an undoped InAsP layer in which percentage of phosphorus in its composition changes from 100% to 80% in a graded manner and an undoped InGaAs layer (indium component: 53%).

Also, according to another embodiment of the present invention, it is desirable that a radio frequency module use, as a fundamental device, a field effect transistor or a HEMT that includes an undoped InAsP (InAs$_{1-x}$P$_x$, X=0.75 to 0.85) layer in which percentage of phosphorus in its composition changes from 75% to 85% and an undoped InGaAs layer as the channel layers of the field effect transistor. Eighty percent phosphorus in the composition is most desirable because the potential barrier difference between the semiconductor layers forming the junction is zero ($\Delta E=0$).

In addition, according to a further embodiment of the present invention, a radio frequency module may use, as a fundamental device, a field effect transistor or a HEMT that includes an undoped InAsP layer in which percentage of phosphorus in its composition changes from 75% to 85% and an undoped InGaAs layer in which percentage of indium in its composition changes from 70% to 53% in a graded manner as the channel layers.

Thickness in a direction of lamination of each channel layer is set at about 2 nm to 20 nm, preferably 5 nm to 10 nm, depending on requirements for device characteristics; however, basically the thickness may be set according to ordinary design.

Figure 2:
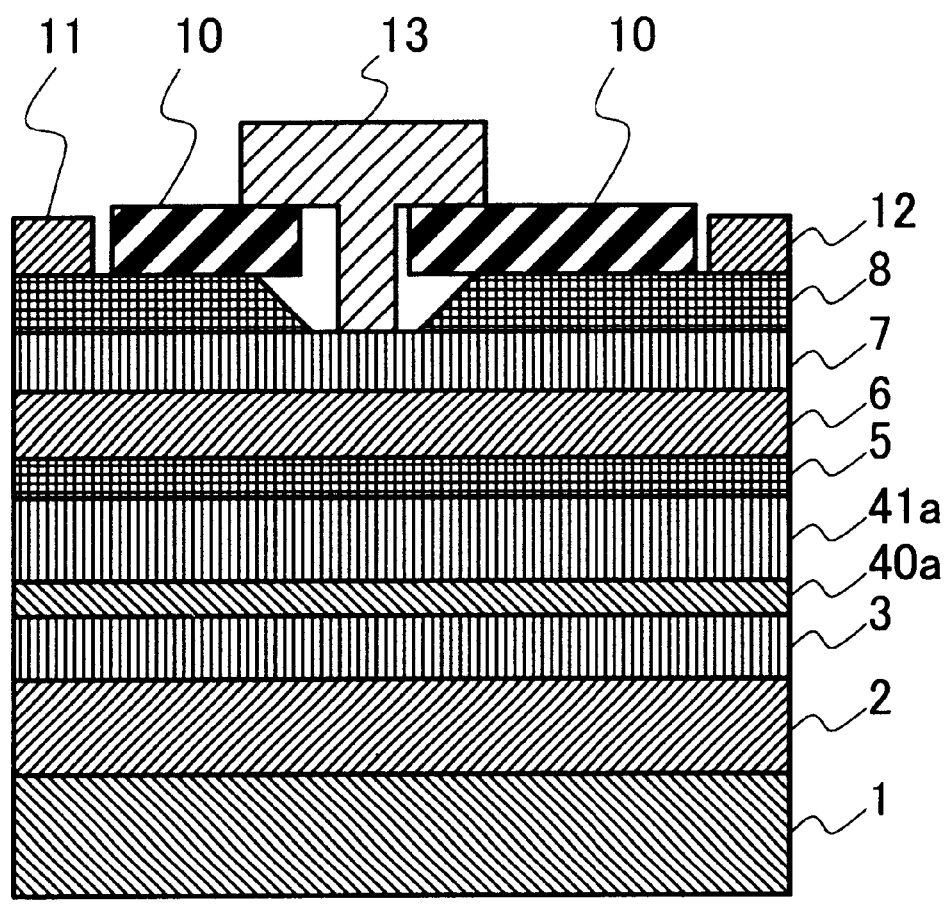
FIG. 2 is a sectional view of a fundamental device to be used in a radio frequency module according to the present invention.
Figure 3:
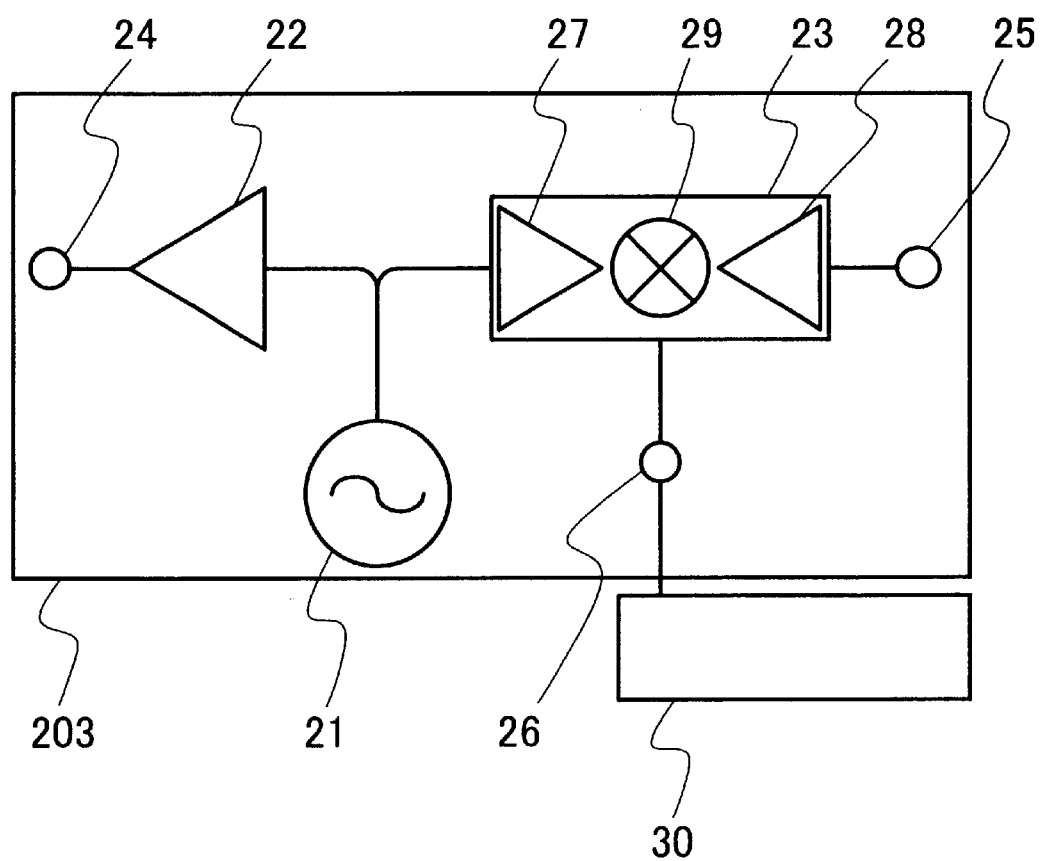
FIG. 3 is a block configuration diagram of a fundamental circuit of a radio frequency module according to the present invention.

A first embodiment of a field effect transistor according to the present invention will next be described with reference to FIG. 2. FIG. 2 is a sectional view of a HEMT to be used in a radio frequency module according to the present invention. A typical configuration example of MMICs is shown in FIG. 3. FIG. 3 is a block diagram showing plane arrangement of the circuit. In FIG. 3, a voltage-controlled oscillator 21, an amplifier 22, and a receiver 23 are each formed with the HEMT illustrated in the first embodiment as a fundamental device, and the voltage-controlled oscillator 21, the amplifier 22, and the receiver 23 form MMICs. The receiver 23 generally includes a first amplifier 27, a second amplifier 28, and a mixer 29 that adds signals from these amplifiers together. The first amplifier 27 amplifies a local oscillator power signal (LO) from the oscillator 21. The second amplifier 28 amplifies a received signal (RF) from a receiving antenna 25.

For example, a signal of 76 GHz from the voltage-controlled oscillator 21 is amplified by the amplifier 22, and then emitted from a transmitting antenna 24. A signal reflected from a target and returned to the circuit is received by the receiving antenna 25 and then amplified by the receiver. The amplified signal is mixed with the reference signal from the voltage-controlled oscillator 21, whereby an intermediate frequency (IF) signal is extracted from a terminal 26. The extracted IF signal is used for a given signal processing system 30 to calculate relative speed, distance, and angle of the target. Although FIG. 3 does not show circuit configuration of the signal processing system 30 for calculating relative speed, distance, and angle of the target, an ordinary circuit suffices for such calculation. In most cases, the signal processing system is provided on a substrate separate from the radio frequency module 203 according to the present invention. A silicon semiconductor device is used for an electric signal processing system in the radio frequency module 203 in many cases.

A specific example of the field effect transistor according to the present invention will be described in detail with reference to FIG. 2.

In this example, a GaAs substrate is used as a substrate 1. An ordinary 0.6-μm thick strain relieving layer 2 for GaAs is formed on the substrate 1, and an undoped InAlAs layer 3 (thickness: 300 nm, In component: 52%) is formed on the strain relieving layer 2 by an ordinary method.

Formed on the undoped InAlAs layer 3 is a so-called HEMT channel layer that comprises an undoped InAsP layer 40a (thickness: 20 nm) in which percentage of phosphorus in its composition changes from 100% to 80% in a graded manner and an undoped InGaAs layer 41a (thickness: 20 nm, In component: 53%). Incidentally, an InP substrate or the like may also be used as a substrate for crystal growth; in this case, it suffices to form channel layers of InAsP and InGaAs on the InP substrate with an InAlAs buffer layer intermediate between the substrate and the channel layers.

Formed sequentially on the undoped InGaAs layer 41a are an undoped InAlAs layer 5 (thickness: 2 nm, In component: 52%), an N-type InAlAs layer 6 (doping concentration: 5×10$^{18}$/cm$^3$, thickness: 12 nm, In component: 52%), an undoped InAlAs layer 7 (thickness: 10 nm, In component: 20%), and an N-type InGaAs layer 8 (doping concentration: 3×10$^{19}$/cm$^3$, thickness: 50 nm, In component: 53%). A device thus obtained will be referred to as a sample A in the following description.

Also, for comparison, a device having a single channel layer is fabricated. Specifically, in this example, only the channel layer is formed by an undoped InGaAs layer 4b (thickness: 40 nm, In component: 53%), and the other layers are the same as those of the sample A. This example will be referred to as a sample B in the following.

Next, a so-called HEMT is fabricated on both the samples A and B by a common process described below.

A silicon oxide film (SiO) 10 (thickness: 400 nm) is formed by a CVD (Chemical Vapor Deposition) method. Then, part of the silicon oxide film (SiO) 10 on the semiconductor substrate thus prepared is removed by an ordinary photolithography process to form regions of a source electrode 11 and a drain electrode 12. A hole is thereafter created in the silicon oxide film (SiO) 10 by ordinary dry etching or wet etching. Then, gold (Au, thickness: 200 nm)/titanium (Ti, thickness: 50 nm) is deposited, and a source electrode 11 and a drain electrode 12 are formed by a lift-off method. Next, an opening pattern is formed between the source electrode 11 and the drain electrode 12 by using an electron beam lithography apparatus.

Thereafter, a hole is created in the silicon oxide film (SiO) by dry etching, and the silicon oxide film (SiO) is deposited by the CVD method, so that the opening mentioned above becomes 0.15 μm. Then, an N-type InGaAs layer 9 is subjected to a wet etching process with a citric acid-based etchant, and molybdenum (Mo, thickness: 20 nm) and aluminum (Al, thickness: 500 nm) are sequentially deposited. A pattern is formed by an ordinary photolithography process so as to overlay the 0.15-μm opening and then milled to thereby form a gate electrode 13. Length of the gate is 0.15 μm.

It is understood from a comparison between the samples A and B illustrated in the following that the field effect transistor according to the present invention can achieve breakdown voltage characteristics better than those of a conventional HEMT, while ensuring the same level of current drivability possessed by a conventional HEMT. In addition, the field effect transistor according to the present invention can achieve noise characteristics that eliminate a noise produced by a conventional composite channel.

Saturation current density, which indicates current drivability of a HEMT, is about 800 mA/mm for the sample A and about 800 mA/mm for the sample B. Thus, according to the present invention, a current drivability value equal to that of a conventional HEMT can be obtained. On the other hand, breakdown voltage is more than 3 V for the sample A and 3 V for the sample B. Thus, breakdown voltage of the sample A according to the present invention is improved as expected.

Figure 4:
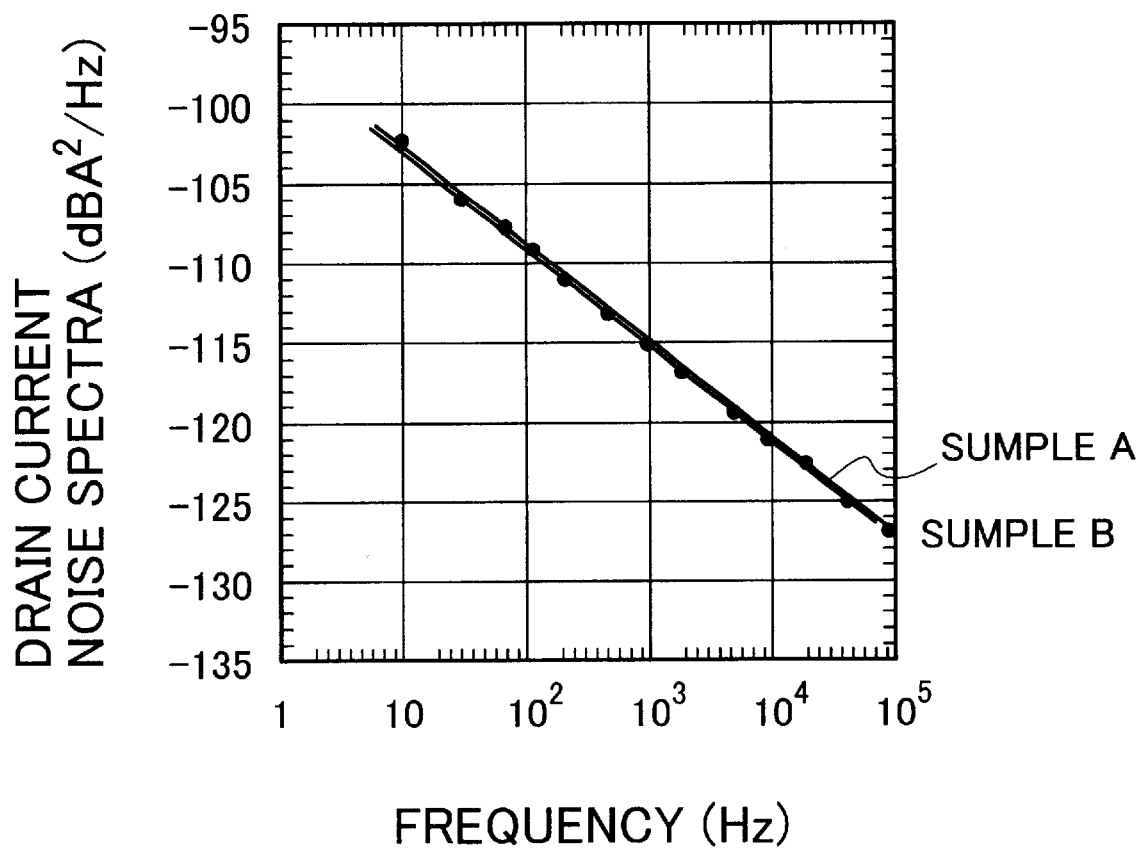
FIG. 4 shows a comparison of frequency dependence of current noise spectrum densities of the fundamental device to be used in a radio frequency module according to the present invention and a fundamental device used in a conventional radio frequency module.

FIG. 4 shows a result of measurement of drain current noise frequency spectra of the samples A and B. The sample A, which is a structure according to the present invention, exhibits −115 dbA$^2$/Hz at 1 kHz, while the sample B, which is a conventional structure, exhibits −115 dbA$^2$/Hz at 1 kHz. The sample B of the conventional structure has been considered to excel in noise characteristics. This indicates that the sample A, a structure of the present invention, is free from noise degradation specific to a structure using a composite channel, and thus possesses excellent noise characteristics.

Table 1 illustrates a comparison of noise degradations specific to structure using a composite channel. The table shows height of a barrier within the channel that impedes traveling of carriers, noise degradation, and whether characteristics obtained are satisfactory for a practical radio frequency device.

TABLE 1

| Barrier height in the composite channel (eV) | Noise degradation (dB) | Characteristics (⊙ excellent, ○ good, X unsatisfactory) |
|---|---|---|
| 0.02 | Substantially no degradation | ⊙ |
| 0.06 | 0.3 | ⊙ |
| 0.1 | 0.45 | ⊙ |
| 0.21 | 1.1 | ○ |
| 0.22 | 1.6 | X |
| 0.4 | 2.2 | X |
| 0.6 | 3.2 | X |

It is shown that in the prior art composite channel comprising a layer of indium, gallium, and arsenic and a layer of indium and phosphorus has a great barrier height of 0.22 eV, thus resulting in a noise degradation of more than 1.5 dB. The above sample A does not have a barrier that impedes traveling of carriers within its channel, and accordingly the sample A exhibits noise characteristics similar to those of a HEMT with a channel structure comprising a single layer of indium, gallium, and arsenic. It is understood from the results of Table 1 that when barrier height in the composite channel is less than 0.22 eV, practically satisfactory and good noise characteristics can be obtained.

It is to be noted that in the present embodiment, layer thickness resulting from epitaxial growth is fixed; however, there is no special reason for the thickness set in the present embodiment. This is because it is important in the present invention to make semiconductor layers forming a channel layer of different materials and to prevent noise degradation caused by a barrier present in an interface between the layers and impeding the traveling of carriers.

It is also to be noted that the present embodiment uses a HEMT having a channel layer comprising an undoped InAsP layer in which percentage of phosphorus in its composition changes from 100% to 80% in a graded manner and an undoped InGaAs layer (indium component: 53%); however, the present invention is not limited to these materials. For example, instead of the undoped InAsP layer in which percentage of phosphorus in its composition changes from 100% to 80% in a graded manner, an undoped InAsP layer in which percentage of phosphorus in its composition is 80% may be used. Alternatively, an undoped InGaAs layer in which percentage of indium in its composition changes from 70% to 53% in a graded manner may be used. This is because according to the present invention, as long as semiconductor layers forming a channel layer are made of different materials and a barrier present in an interface between the layers and impeding the traveling of carriers is less than 0.22 eV, a value of the prior art, it is possible to suppress noise degradation and to thereby provide a high-output amplifier MMIC.

Although it is omitted in the above description, many MMIC devices are generally fabricated on a single wafer, as illustrated in FIG. 1. Therefore, in mass-producing the devices, the devices are subjected to ordinary photolithography and etching processes in the form of a wafer, and then separated from one another to form individual modules.

Features of the field effect transistor according to the present invention will next be described by comparison with the prior art.

A problem with the prior arts arises from output of an amplifier MMIC being a function of device current drivability and breakdown voltage. For example, a decrease in breakdown voltage leads to a decrease in output of the amplifier MMIC, while an improvement in current drivability leads to an improvement in output of the amplifier MMIC.

A HEMT used in the prior art amplifier MMIC has a practical problem in breakdown voltage of its channel material. Specifically, a combination of indium, gallium, and arsenic with a high indium content, which can be expected to allow high-speed traveling of carrier electrons, is used as the channel material. Hence, as described above, the channel material improves current drivability, and therefore a higher output can be expected. However, when the above HEMT is used as a radio frequency device for forming an MMIC, a combination of indium, gallium, and arsenic with a high indium content is used as its channel layer. Hence, the band gap of the channel layer is small, and a breakdown due to avalanche effect tends to occur at a portion beside the gate on the drain side, where an electric field is concentrated. This results in a decrease in breakdown voltage of the device. Thus, according to the prior art mentioned above, output is actually not as high as expected.

On the other hand, a device with a composite channel has a problem in that noise is produced by the presence of a barrier of band structure at an interface between a plurality of semiconductor layers that form the composite channel. A typical example of the composite channel is formed by a layer of indium, gallium, and arsenic and a layer of indium and phosphorus. In general, there is a barrier of about 0.22 eV or more at an interface between the layer of indium, gallium, and arsenic and the layer of indium and phosphorus. This barrier impedes traveling of carriers, thereby resulting in an increase in noise produced by the HEMT. As a result, because of this noise, no improvement in the S/N ratio of the radio frequency module can be expected.

Characteristics of the field effect transistor according to the present invention will next be described with reference to diagrams of band structure at a heterojunction.

Figure 5:
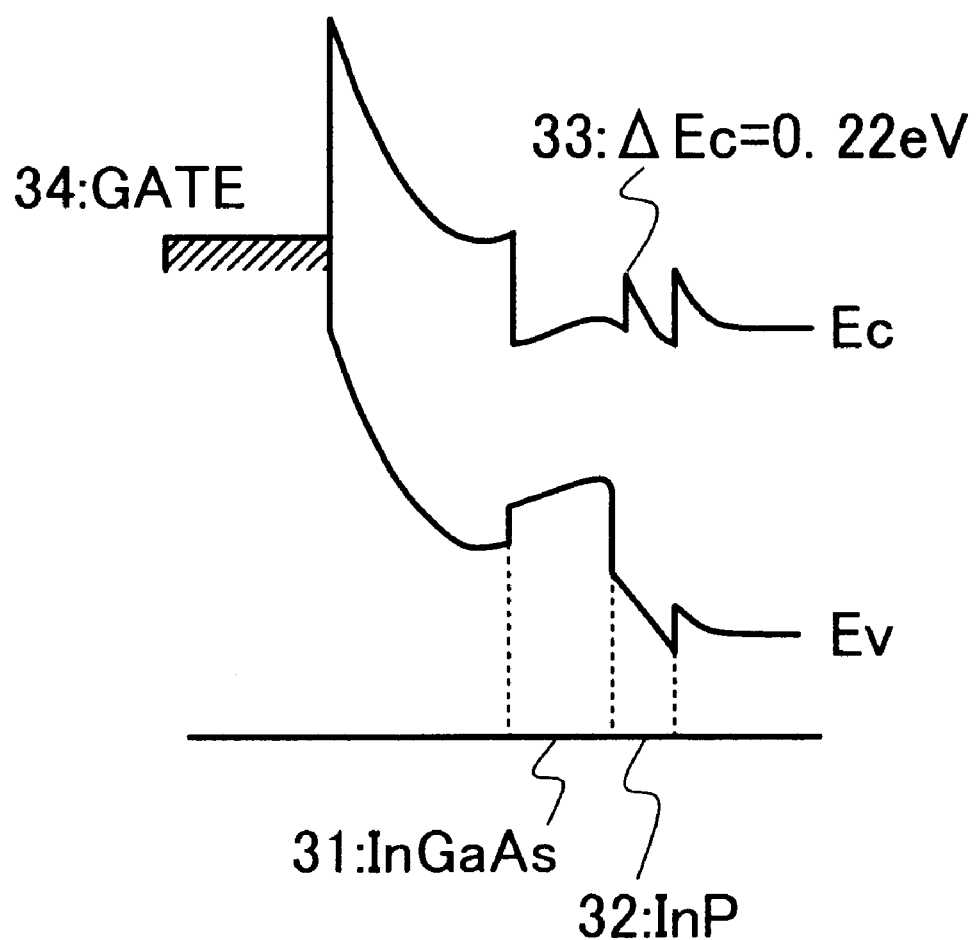
FIG. 5 is a diagram of a band structure at an interface of a composite channel of a conventional field effect transistor.

FIG. 5 shows a band structure at a heterojunction according to the prior art. FIG. 5 shows a band structure in a section taken in a direction of lamination of a semiconductor laminate, in which a lower end of a conduction band (Ec) and an upper end of a valence band (Ev) are shown. A composite channel in this case comprises InGaAs 31 and InP 32. The channel region is controlled by a gate electrode 34. A heterojunction interface 33 in the lower end portion of the conduction band has a band gap difference of 0.22 eV. Thus, carriers traveling in the channel are impeded in traveling or scattered, which consequently appears as a noise in an electric signal.

Figure 6:
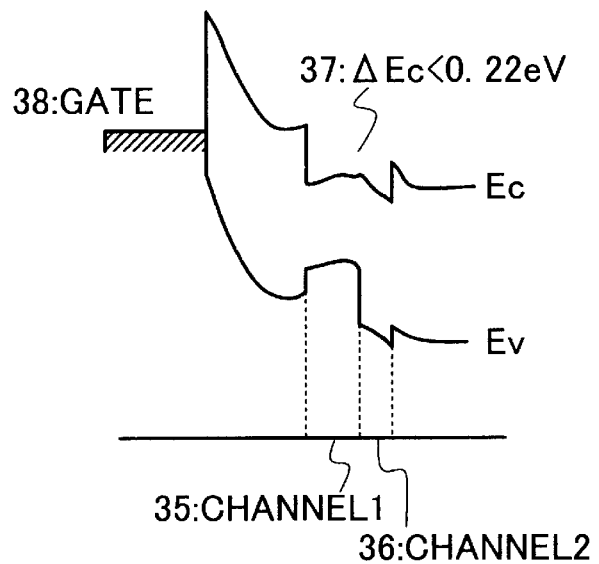
FIG. 6 is a diagram of a band structure at an interface of a composite channel of a field effect transistor according to the present invention.

Similarly to FIG. 5, FIG. 6 shows a band structure at a heterojunction according to the present invention. FIG. 6 shows a band structure in a section taken in a direction of lamination of the semiconductor laminate shown in FIG. 1. A composite channel in this case comprises InGaAs 35 and InAsP 36, for example. In FIG. 6, reference numeral 38 denotes a gate electrode. A heterojunction interface 37 in a lower end portion of a conduction band has only a band gap difference of less than 0.22 eV. Thus, according to the present invention, carriers traveling in the channel are not impeded in traveling nor scattered, or the impediment or the scattering is negligible if any, so that noise does not appear in an electric signal or remains at a level that does not present a practical problem. Incidentally, the band gap difference in FIG. 6 is shown slightly exaggerated for a better understanding.

The band gap difference is less than 0.22 eV as described above, and therefore is better than that of the prior art. However, a band gap difference of 0.1 eV or less is desirable, and a band gap difference of 0.05 eV or less is particularly desirable.

It is to be noted that the above embodiment uses a high electron mobility transistor (HEMT), which is one type of field effect transistor; however, the present invention is not limited to a high electron mobility transistor. It is to be understood that the same effects can be obtained by applying the present invention to all kinds of field effect transistors such as a MESFET (Metal Semiconductor Field Effect Transistor) and a MOSFET (Metal Oxide Semiconductor Field Effect Transistor).

Figure 7:
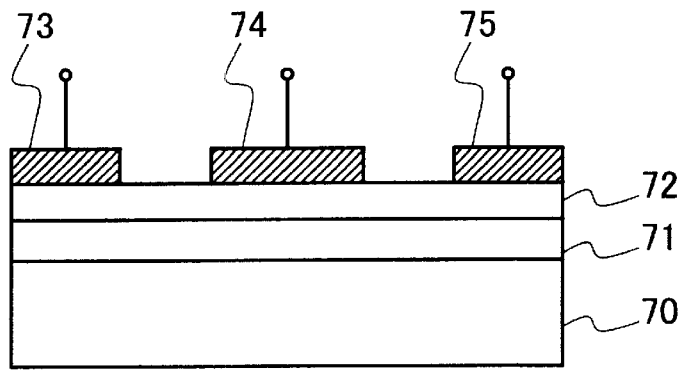
FIG. 7 is a sectional view of another field effect transistor according to the present invention.

FIG. 7 is a sectional view of a MESFET device to be illustrated as another example of a field effect transistor.

An n-type active layer region, that is, a channel region (71 and 72) is formed on a semiconductor substrate 70, for example a GaAs substrate. The channel region in this case also forms a composite channel. The first channel layer 72 is made of GaAs, and the second channel layer is made of InGaP. A laminate of platinum and gold to form a Schottky contact is formed as a gate electrode 74 on the compound semiconductor layer 72. As in normal practice, laminates of gold, germanium, and nickel or the likes are used as a source electrode 73 and a drain electrode 74. Also in the case of a composite channel of such a MESFET, a barrier at a junction interface is made less than a given value as described earlier regarding the HEMT, a typical example of a field effect transistor, whereby an excellent S/N ratio can be obtained. Furthermore, it is possible to achieve a higher output while ensuring excellent noise characteristics.

Next, a radio-frequency module according to the present invention that comprises an MMIC fabricated with the HEMT of the present embodiment used as a fundamental device will be applied to an automotive radar module as an example.

A schematic plan view of an automotive radar module in this example is the same as FIG. 3.

Figure 8:
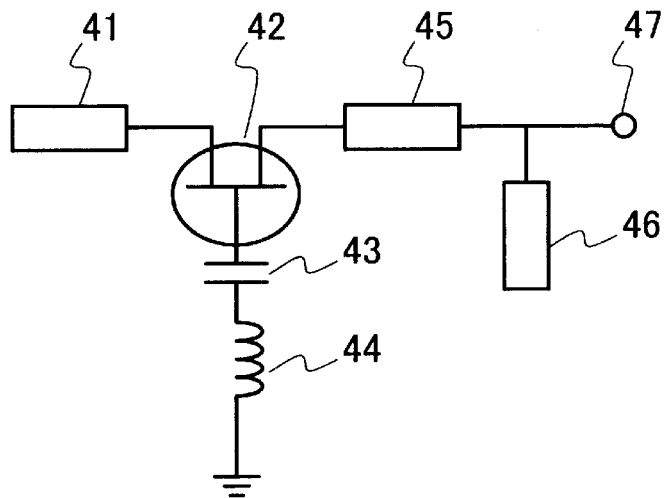
FIG. 8 is a diagram of a fundamental circuit configuration of an oscillator.
Figure 9:
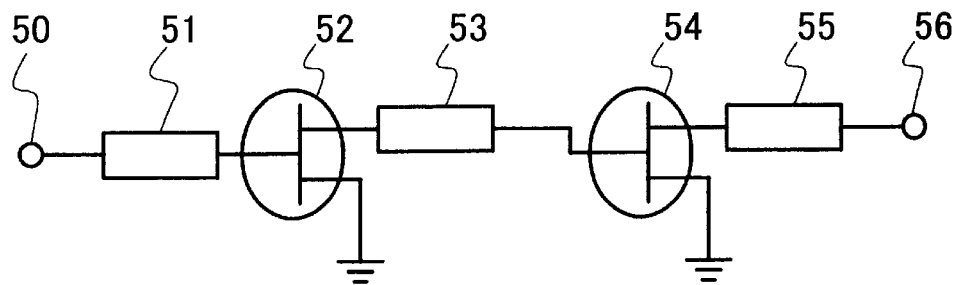
FIG. 9 is a diagram of a fundamental circuit configuration of an amplifier.

FIGS. 8 and 9 show fundamental circuit configurations of an oscillator and an amplifier used in a receiver and a transmitter, respectively, for use in the MMIC configuration. The oscillator is formed as follows. A capacitor 43 and an inductance 44 are connected to a gate of a field effect transistor 42 according to the present invention. A first impedance 41 is connected to a first impurity region of the field effect transistor 42, and a second impedance 45 and a third impedance 46 are connected to a second impurity region of the field effect transistor 42. An oscillating signal is outputted from a terminal 47 to the exterior of the oscillator. On the other hand, the amplifier is formed such that field effect transistors 52 and 54 according to the present invention are connected in series with each other by using impedances 51, 53, and 55. A signal from an input terminal 50 is amplified, and then outputted from an output terminal 56 to the exterior of the amplifier.

Figure 10:
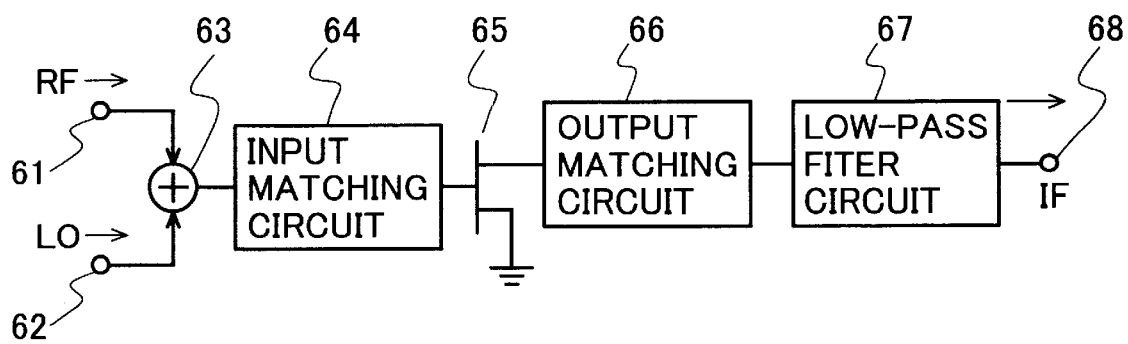
FIG. 10 is a diagram of a fundamental circuit configuration of a mixer.

FIG. 10 shows an example of a mixer. This example is a single-ended FET mixer. The mixer is used as the mixer 29 in FIG. 3, for example.

A received signal (RF) and a local oscillator power (LO) are inputted from their respective input terminals 61 and 62, and added to each other by an adder 63. In order to extract only an intermediate frequency (IF) component, or a frequency component representing a difference between the RF and the LO, high-frequency components are removed by a low-pass filter circuit on the output side. Thus, a signal goes through an input matching circuit 64, a transistor 65, an output matching circuit 66, and the low-pass filter circuit 67, whereby an IF component is extracted from an output terminal 68.

Of course, oscillators and amplifiers of types other than those illustrated in this example are conceivable. However, an object of the present invention can be achieved by adopting the field effect transistor according to the present invention as a field effect transistor used in this example. It is needless to say that it is most desirable to adopt field effect transistors according to the present invention as the field effect transistors used in this electric circuit configuration.

A signal of 76 GHz from the voltage-controlled oscillator 21 is amplified by the amplifier 22, and then emitted from the transmitting antenna 24. A signal reflected from a target and returned to the circuit is received by the receiving antenna 25 and then amplified by the receiver. The signal is then mixed with the reference signal from the voltage-controlled oscillator 21, whereby an intermediate frequency (IF) signal is extracted from the terminal 26. The extracted IF signal is used to calculate relative speed, distance, and angle of the target. Although the figure does not show a circuit configuration for calculating relative speed, distance, and angle of the target, an ordinary circuit suffices for such calculation.

It is particularly important in the present invention that the field effect transistors of the oscillator, the receiver, and the transmitter incorporated in the radio frequency module be provided in accordance with the present invention, as described above.

An automotive radar using the automotive radar module of the present embodiment can achieve a higher output without noise degradation, and thus its SIN ratio is improved by 3 dB as compared with a conventional radar. As a result, the detection distance and the detection angle of the radar are improved by 25% and 50%, respectively, as compared with a conventional radar.

The radio frequency module according to the present invention is useful in detecting a reflected radio wave of a radio wave oscillated by the module. A typical example of a technique for detecting a reflected radio wave of a radio wave generated by self-oscillation is a technique for moving target detection by radars for vehicles, automobiles, and the like.

In detecting such a reflected radio wave, for example in moving target detection, a higher radio wave output of the transmitter and a lower noise are particularly desired as compared with ordinary communications. The present invention makes it possible to meet both requirements of a higher output and a lower noise.

In addition, the present invention provides not only the above advantages on the transmitter side but also advantages on the receiver side. When radio systems and radar systems for moving target detection and vehicle collision prevention receive a weak signal, performance of the systems can be determined by a noise occurring in a mixer within the receiver.

According to the present invention, it is possible to reduce noise occurring within the receiver by using a field effect transistor according to the present invention in the receiver. Therefore, it is possible to achieve better noise and S/N ratio characteristics than those of a conventional receiver even when a received signal is weak. The present invention is especially useful in detecting a reflected radio wave of a radio wave generated by self-oscillation as described above. Thus, by applying the present invention on both the transmitter side and the receiver side, it is possible to achieve both the characteristics of a high output and a low noise to be ensured on the transmitter side and the characteristic of a low noise on the receiver side. Thus, the system as a whole ensures a high output and has a high S/N ratio.

While embodiments of the present invention have been described, it is to be understood that the present invention is not limited to the embodiments described above, and various designs may be made without departing from the spirit of the present invention. For example, the present invention may be applied not only to the 76-GHz millimeter wave automotive radar of the above embodiment but also to other microwave radio communications and millimeter wave radio communications. When the present invention is applied to microwave radio communications or millimeter wave radio communications, it is possible to provide a radio system with a long communication distance or a large number of channels and the like.

Since the radio frequency module according to the present invention uses a HEMT that prevents noise degradation and achieves high breakdown voltage and high current drivability, the radio frequency module can achieve a high output and a high S/N ratio with no noise degradation. When the radio frequency module is applied to a millimeter wave automotive radar, it is possible to provide a highly reliable automotive radar system having a long detection distance and a great detection angle.

According to the present invention, it is possible to provide a radio frequency module and a module for moving target detection incorporating an MMIC having a high S/N ratio.

Moreover, according to the present invention, it is possible to provide a radio frequency module and a module for moving target detection incorporating an MMIC having a high S/N ratio while ensuring a high output.

In order to facilitate understanding of the drawings, main reference numerals are shown in the following.

1 . . . GaAs substrate, 2 . . . strain relieving layer, 3 . . . undoped InAlAs layer, 40a . . . undoped InAsP layer (P content gradually changes from 100% to 80%), 40b . . . undoped InAsP layer, 41 . . . undoped InGaAs layer, 5 . . . undoped InAlAs layer, 6 . . . N-type InAlAs layer, 7 . . . undoped InAlAs layer, 8 . . . N-type InGaAs layer, 10 . . . SiO film, 11 . . . source electrode, 12 . . . drain electrode, 13 . . . gate electrode, 21 . . . voltage-controlled oscillator, 22 . . . amplifier, 23 . . . receiver, 24 . . . transmitting antenna, 25 . . . receiving antenna, and 26 . . . terminal for intermediate frequency (IF) signal.

What is claimed is:

1. A monolithic microwave integrated circuit device comprising a field effect transistor having a channel region with a junction of two or more different kinds of materials and height of a potential barrier of a junction interface between the different kinds of materials in said channel region being less than 0.22 eV.

2. The monolithic microwave integrated circuit device according to claim 1,
wherein said monolithic microwave integrated circuit device includes at least an oscillator, an amplifier, and a receiver, at least one of said oscillator, said amplifier, and said receiver including said field effect transistor.

3. The monolithic microwave integrated circuit device according to claim 2,
wherein said monolithic microwave integrated circuit device further includes a terminal for extracting an intermediate frequency signal by mixing an output signal from said receiver with an output signal from said oscillator.

4. The monolithic microwave integrated circuit device according to claim 1,
wherein said field effect transistor comprises:
a first semiconductor layer containing an impurity; and
a second semiconductor layer having a smaller band gap than that of the first semiconductor layer,
wherein said first semiconductor layer and said second semiconductor layer are joined together to form a heterostructure, said second semiconductor layer containing substantially no impurity, and at least said second semiconductor layer forming said channel region.

5. The monolithic microwave integrated circuit device according to claim 3,
wherein the junction of said different kinds of materials is formed by a heterostructure comprising a first semiconductor layer containing an impurity and a second semiconductor layer having a smaller band gap than that of the first semiconductor layer, said second semiconductor layer containing substantially no impurity.

6. A monolithic microwave integrated circuit device comprising an oscillator, an amplifier, and a receiver, at least one of said oscillator, said amplifier, and said receiver including a field effect transistor having a channel region with a junction of two or more different kinds of materials,
wherein said field effect transistor is a fundamental device and includes, as said channel region, an undoped InAsP layer having a percentage of phosphorus that gradually changes from 100% to 80%, and an undoped InGaAs layer.

7. The monolithic microwave integrated circuit device according to claim 1,
wherein said field effect transistor is a fundamental device and includes, as said channel region, an undoped InAsP layer having a percentage of phosphorus that gradually changes from 100% to 80%, and an undoped InGaAs layer.

8. The monolithic microwave integrated circuit device according to claim 2,
wherein said field effect transistor is a fundamental device and includes, as said channel region, an undoped InAsP layer having a percentage of phosphorus that gradually changes from 100% to 80%, and an undoped InGaAs layer.

9. The monolithic microwave integrated circuit device according to claim 3,
wherein said field effect transistor is a fundamental device and includes, as said channel region, an undoped InAsP layer having a percentage of phosphorus that gradually changes from 100% to 80%, and an undoped InGaAs layer.

10. The monolithic microwave integrated circuit device according to claim 4,
wherein said field effect transistor is a fundamental device and includes, as said channel region, an undoped InAsP layer having a percentage of phosphorus that gradually changes from 100% to 80%, and an undoped InGaAs layer.

11. The monolithic microwave integrated circuit device according to claim 5,
wherein said field effect transistor is a fundamental device and includes, as said channel region, an undoped InAsP layer having a percentage of phosphorus that gradually changes from 100% to 80%, and an undoped InGaAs layer.

12. A monolithic microwave integrated circuit device comprising an oscillator, an amplifier, and a receiver, at least one of said oscillator, said amplifier, and said receiver including a field effect transistor having a channel region with a junction of two or more different kinds of materials,
wherein height of a potential barrier of a junction interface between the different kinds of materials in said channel region is less than 0.22 eV.

* * * * *